United States Patent
Fukui

(10) Patent No.: US 6,696,506 B1
(45) Date of Patent: Feb. 24, 2004

(54) CATIONIC PHOTOCATALYST COMPOSITION AND PHOTOCURABLE COMPOSITION

(75) Inventor: Hiroji Fukui, Kyoto (JP)

(73) Assignee: Sekisui Chemical Co., Ltd., Osaka (JP)

( * ) Notice: Subject to any disclaimer, the term of this patent is extended or adjusted under 35 U.S.C. 154(b) by 0 days.

(21) Appl. No.: 09/719,166

(22) PCT Filed: Aug. 5, 1999

(86) PCT No.: PCT/JP99/04253

§ 371 (c)(1), (2), (4) Date: Dec. 13, 2000

(87) PCT Pub. No.: WO00/12584

PCT Pub. Date: Mar. 9, 2000

(30) Foreign Application Priority Data

Aug. 28, 1998 (JP) .......................................... 10-243175

(51) Int. Cl.⁷ ............................... C08F 2/46; C08F 2/50
(52) U.S. Cl. ............................. 522/31; 522/32; 522/64; 522/65; 522/66; 522/100; 522/170; 522/181; 522/168
(58) Field of Search .......................... 522/25, 31, 38, 522/64, 66, 100, 170, 181, 168, 65

(56) References Cited

U.S. PATENT DOCUMENTS

| | | | | |
|---|---|---|---|---|
| 4,985,340 A | * | 1/1991 | Palazzotto et al. ....... | 430/270.1 |
| 5,494,943 A | * | 2/1996 | Mahoney et al. .......... | 522/66 |
| 5,554,664 A | * | 9/1996 | Lamanna et al. ........... | 522/25 |
| 5,672,637 A | * | 9/1997 | Mahoney et al. .......... | 522/25 |
| 5,716,551 A | * | 2/1998 | Unruh et al. ................ | 252/500 |
| 5,962,546 A | * | 10/1999 | Everaerts et al. ........... | 522/25 |
| 6,117,944 A | * | 9/2000 | Nishikubo et al. .......... | 525/109 |
| 6,218,482 B1 | * | 4/2001 | Yamanaka et al. .......... | 525/524 |

* cited by examiner

*Primary Examiner*—James J. Seidleck
*Assistant Examiner*—Sanza L. McClendon
(74) *Attorney, Agent, or Firm*—Townsend & Banta

(57) ABSTRACT

A cationic photocatalyst composition and a photocurable composition utilizing cationic polymerization are provided which can present sufficient open time and adhesion.

The cationic photocatalyst composition contains a photosensitive onium salt and a compound represented by the following formula (1). The photocurable composition contains the cationic photocatalyst composition and an epoxy compound having at least one epoxy group per molecule.

Formula (1) [Compound B]

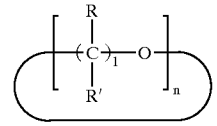

(wherein R and R' are suitably selected from hydrogen, halogen, saturated hydrocarbon groups, unsaturated hydrocarbon groups, substituting groups comprising any suitable combination of elements such as carbon, hydrogen, oxygen, nitrogen and sulfur; and l and n each is an integer of 2 or larger).

6 Claims, No Drawings

CATIONIC PHOTOCATALYST COMPOSITION AND PHOTOCURABLE COMPOSITION

TECHNICAL FIELD

The present invention relates to a cationic photocatalyst composition and a photocurable composition incorporating the cationic photocatalyst composition. More particularly, the present invention relates to a cationic photocatalyst composition and a photocurable composition which can assure a sufficient open time after irradiation and enhance adhesive strength after cure.

BACKGROUND ART

Aryl diazonium, triaryl sulfonium, diaryl iodonium, benzyl sulfonium and phosphonium salts are conventionally known as cationic photocatalysts which polymerize or cure compounds containing an epoxy or other cationically polymerizable group. These cationic photocatalysts are used in combination with compounds containing cationically polymerizable groups, such as epoxy resins, oxetane derivatives and vinyl ether derivatives, to provide compositions useful for photopolymerization or photocure.

A variety of industrial uses have been investigated for the aforementioned compositions utilizing a photocure reaction, including paints, coatings, varnishes, matrices for composite materials, materials for giving light-developed forms, adhesives and pressure-sensitive adhesives. Particularly, the application of epoxy resins on such various uses has been investigated because they, when cured, show excellent adhesion, creep resistance, light stability, heat stability, chemical stability and the like ("Newly-revised Epoxy Resin", Hiroshi Kakiuchi, Shoko-do, 1985).

In order for compositions to be useful for the above-described purposes, they when cured must show good adhesion to an adherend and good light stability. In addition, they must have the ability to cure quickly when cationically photopolymerized, i.e., fast-curing property. Where they are formulated into paints, coatings or varnishes, curing thereof is desired to complete as soon as irradiation is terminated. That is, it is strongly demanded that curing thereof completes quickly within a short exposure time.

Adhesives and pressure-sensitive adhesives utilizing cationic photopolymerization have been also noted. Such adhesives, when cured via cationic photopolymerization, show excellent levels of creep resistance, light stability, water resistance, heat stability and chemical stability and high adhesive strength. In addition, they show good adhesion to various materials such as metals, plastics and glasses. Adhesives, pressure-sensitive adhesives or the like have been thus proposed which utilize cationic photocure of cationically photopolymerizable compounds such as epoxy resins.

When in use for joining adherends, such adhesives, pressure-sensitive adhesives or the like are required to show fast-curing characteristics as required for paints, coatings and varnishes, and to simultaneously provide a sufficiently long work time (a period of time which permits a joint operation after they are irradiated, also referred to as an open time) to permit a joint operation. That is, it is strongly demanded that they remain sufficiently flowable, wet and tacky to permit a joint operation after they have been irradiated.

In Japanese Patent Laying-Open No. Sho 63-248825, slow-curing type UV-curable epoxy resins are disclosed utilizing a fixing agent containing a poly(alkylene oxide) residue portion. The use of fixing agent containing a poly(alkylene oxide) residue portion reduces the occurrence of skinning after exposure to an ultraviolet ray. The skinning refers to a condition wherein a skin layer is caused to cure by irradiation to reduce its wettability, tackiness and the like while an interior maintains its flowability.

In accordance with the teaching of Japanese Patent Laying-Open No. Sho 63-248825, the occurrence of skinning is successfully retarded by the use of fixing agent containing a poly(alkylene oxide) residue portion. However, since this reference contemplates to satisfy the skinning-preventive property and adhesive property simultaneously by the use of such a fixing agent. It has been accordingly difficult to design such properties independently.

Japanese Patent Laying-Open No. Hei 3-172378 discloses photocurable epoxy adhesive compositions which contain an epoxide cure retarder selected from the group consisting of nitrile- or vinyl ether-substituted organic materials. The to use of vinyl ether-substituted organic materials is reported to assure an open time of about 40 minutes. Japanese Patent Laying-Open No. Hei 3-172378 discloses photocurable epoxy adhesive compositions with an extended open time. No reference is however made as to the adhesive property, i.e., adhesive strength of such adhesive compositions.

In view of the current state of the art as described above, it is an object of the present invention to provide a cationic photocatalyst composition and a photocurable composition incorporating the cationic photocatalyst composition which are suitable for use in adhesives or pressure-sensitive adhesives utilizing cationic photopolymerization, which can present a sufficiently long open time after they are irradiated and which, when cured, provide a sufficiently high adhesive strength.

DISCLOSURE OF THE INVENTION

In accordance with a broad aspect of the present invention, a cationic photocatalyst composition is provided which is characterized as containing a photosensitive onium salt and a compound either represented by the following formula (1) or having a substituting group represented by the following formula (1).

Formula (1) [Compound B]

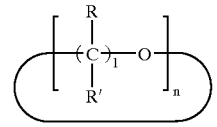

In the formula (1), R and R' are suitably selected from hydrogen, halogen, saturated hydrocarbon groups, unsaturated hydrocarbon groups, substituting groups comprised of any suitable combination of elements such as carbon, hydrogen, oxygen, nitrogen and sulfur, and the like. l and n each is an integer of 2 or larger.

In accordance with another broad aspect of the present invention, a photocurable composition is provided which is characterized as containing the above-specified cationic photocatalyst composition and a compound having at least one cationically polymerizable group in a molecule.

In the present invention, a preferred cationically polymerizable group is an epoxy group.

A detailed description of the present invention is below given.

The cationic photocatalyst composition in accordance with the present invention contains the above-specified photosensitive onium salt which shows excellent cationic photocatalytic activity, and a compound either represented by the formula (1) or containing, as a substituting group, a structure of the formula (1).

Examples of onium salts include, but not limited to, aromatic diazonium salts, aromatic iodonium salts, aromatic sulfonium salts and the like. The use of photosensitive onium salts which exhibit low thermal catalytic activities in the approximate temperature range of 20–80° C. is preferred for their ability to increase the storage stability of the composition.

Specific examples of photosensitive onium salts include IRGACURE 261 (product of Ciba-Geigy), OPTOMER SP-150 (product of Asahi Denka Ind. Co., Ltd.), OPTOMER SP-151 (product of Asahi Denka Ind. Co., Ltd.), OPTOMER SP-170 (product of Asahi Denka Ind. Co., Ltd.), OPTOMER SP-171 (product of Asahi Denka Ind. Co., Ltd.), UVE 1014 (product of General Electronics Co., Ltd.), CD 1012 (product of Sartomer), SANAID SI-60L (product of Sanshin Chem. Ind. Co., Ltd.), SANAID SI-80L (product of Sanshin Chem. Ind. Co., Ltd.), SANAID SI-10L (product of Sanshin Chem. Ind. Co., Ltd.), CI-2064 (product of Nippon Soda Co., Ltd.), CI-2639 (product of Nippon Soda Co., Ltd.), CI-2624 (product of Nippon Soda Co., Ltd.), CI-2481 (product of Nippon Soda Co., Ltd.), RHODORSIL PHOTOINITIATOR 2074 (product of Rhone Poulenc GmbH), UVI-6990 (product of Union Carbide), BBI-103 (product of Midori Chem. Co., Ltd.), MPI-103 (product of Midori Chem. Co., Ltd.), TPS-103 (product of Midori Chem. Co., Ltd.), MDS-103 (product of Midori Chem. Co., Ltd.), DTS-103 (product of Midori Chem. Co., Ltd.), NAT-103 (product of Midori Chem. Co., Ltd.), NDS-103 (product of Midori Chem. Co., Ltd.) and the like.

The above-listed photosensitive onium salts may be used alone or in any combination thereof.

The compound either represented by the formula (1) or containing, as a substituting group, a structure of the formula (1) is incorporated in the composition to extend an open time for the case where the cationic photocatalyst composition according to the present invention is utilized for a photocurable composition. As indicated by the formula (1), this compound is not particularly specified, so long as it is a cyclic compound having ether and alkylene linkages or a compound having such a cyclic structure as a substituting group. In the above-specified formula (1), R and R' are not particularly limited and may suitably be selected from hydrogen, halogen, saturated hydrocarbon groups, unsaturated hydrocarbon groups, substituting groups comprising any suitable combination of elements such as carbon, hydrogen, oxygen, nitrogen and sulfur, and the like. l and n each is an integer of 2 or larger.

The compounds B-1–B-5 defined as respectively having the following formulas (2)–(6) are preferably used for the compound represented by the formula (1).

Formula (2) [Compound B-1]

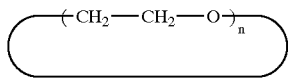

Formula (3) [Compound B-2]

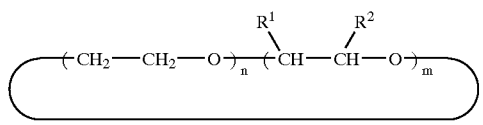

Formula (4) [Compound B-3]

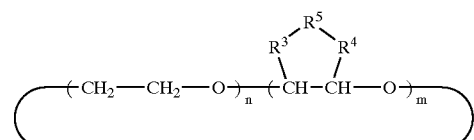

Formula (5) [Compound B-4]

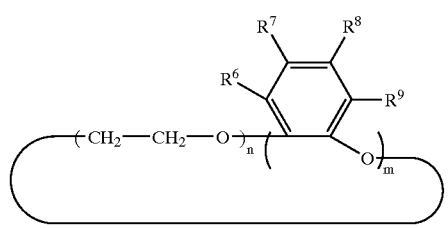

Formula (6) [Compound B-5]

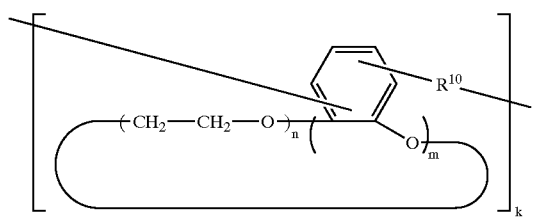

In the formulas (3)–(6), $R^1$–$R^{10}$ may be suitably selected from hydrogen, halogen, saturated hydrocarbon groups, unsaturated hydrocarbon groups, substituting groups comprising any suitable combination of elements such as carbon, hydrogen, oxygen, nitrogen and sulfur, and the like. m, n and k are integers, respectively. While not limiting, those compounds represented by the formulas (3)–(6) may have their respective repeating units arranged in a block or random fashion.

Specific examples of compounds represented by the formula (1) include 12-crown-4, 15-crown-5, 18-crown-6, 24-crown-8, 30-crown-10, 2-aminomethyl-12-crown-4, 2-aminomethyl-15-crown-5, 2-aminomethyl-18-crown-6, 2-hydroxymethyl-12-crown-4, 2-hydroxymethyl-15-crown-5, 2-hydroxymethyl-18-crown-6, dicyclohexano-18-crown-6, dicyclohexano-24-crown-8, dibenzo-18-crown-6, dibenzo-24-crown-8, dibenzo-30-crown-10, benzo-12-crown-4, benzo-15-crown-5, benzo-18-crown-6, 4'-aminobenzo-15-crown-5, 4'-bromobenzo-15-crown-5, 4'-formylbenzo-15-crown-5, 4'-nitrobenzo-15-crown-5, bis[(benzo-15-crown-5)-15-ylmethyl]pimelate, poly[(dibenzo-18-crown-6)-coformaldehyde], and the like.

The compounds either represented by the formula (1) or containing a structure of the formula (1) as a substituting group may be used alone or in any combination.

Preferably, the compound either represented by the formula (1) or containing a structure of the formula (1) as a substituting group is incorporated into the cationic photocatalyst composition of the present invention in the amount of 0.001–100 parts by weight, based on 1 part by weight of the photosensitive onium salt. The loading of the compound either represented by the formula (1) or containing a structure of the formula (1) as a substituting group in the amount of below 0.001 parts by weight may result in the failure to fully obtain an effect of extending an open time as a result of its addition. On the other hand, the loading thereof in the amount of above 100 parts by weight may extend an open time but slow a cure reaction to the level substantially close to termination, resulting in the difficulty to simultaneously optimize the open time and cure rate. More preferably, the compound either represented by the formula (1) or containing a structure of the formula (1) as a substituting group is incorporated into the cationic photocatalyst composition of the present invention in the amount of 0.01–10 parts by weight, based on 1 part by weight of the photosensitive onium salt. This facilitates the simultaneous optimization of open time and cure rate.

Besides the above-described onium salt and the compound either represented by the formula (1) or containing a structure of the formula (1) as a substituting group, the cationic photocatalyst composition in accordance with the present invention may further contain suitable additives, such as a reactive diluent, a solvent and the like.

The photocurable composition in accordance with the present invention is characterized as containing the cationic photocatalyst composition in accordance with the present invention and a compound containing at least one cationically polymerizable group in a molecule.

The cationically polymerizable group incorporated in the compound is not particularly specified in type, so long as it is a functional group that polymerizes by a cationic mechanism, and may be vinyloxy, styryl, epoxy, oxetanyl or the like. An epoxy group is preferred for its ability to provide good adhesion and durability.

Specific examples of vinyloxy-containing compounds include, but not limited to, n-propyl vinyl ether, n-butyl vinyl ether, isobutyl vinyl ether, tert-butyl vinyl ether, tert-amyl vinyl ether, cyclohexyl vinyl ether, 2-ethylhexyl vinyl ether, dodecyl vinyl ether, octadecyl vinyl ether, 2-chlordethyl vinyl ether, ethylene glycol butyl vinyl ether, triethylene glycol methyl vinyl ether, 4-vinyloxy butyl benzoate, ethylene glycol divinyl ether, diethylene glycol divinyl ether, triethylene glycol divinyl ether, tetraethylene glycol divinyl ether, butane-1,4-diol-divinyl ether, hexane-1,6-diol-divinyl ether, cyclohexane-1,4-dimethanol-divinyl ether, di(4-vinyloxy) butyl isophthalate, di(4-vinyloxy) butyl glutarate, di(4-vinyloxy) butyl succinate, trimethylolpropane trivinyl ether, 2-hydroxyethyl vinyl ether, 4-hydroxybutyl vinyl ether, 6-hydroxyhexyl vinyl ether, cyclohexane-1,4-dimethanol-monovinyl ether, diethylene glycol monovinyl ether, 3-aminopropyl vinyl ether, 2-(N,N-diethylamino)ethyl vinyl ether, urethane vinyl ether, polyester vinyl ether and the like.

Examples of styryl-containing compounds include, but not limited to, styrene, p-methylstyrene, α-methylstyrene, p-methoxystyrene, p-tert-butoxystyrene, p-chloromethylstyrene, p-acetoxystyrene, divinylbenzene and the like.

Examples of epoxy-containing compounds include, but not limited to, bisphenol A based epoxy resins, hydrogenated bisphenol A based epoxy resins, nobolac type epoxy resins, cycloaliphatic epoxy resins, brominated epoxy resins, rubber modified epoxy resins, urethane modified epoxy resins, glycidyl ester compounds, epoxidized polybutadiene, epoxidized styrene-butadiene-styrene and the like.

The above-listed compounds having at least one cationically polymerizable group in a molecule may be used alone or in any combination. Other applicable compounds may have two different types of cationically polymerizable groups in a molecule.

Preferably, the photocurable composition in accordance with the present invention contains the aforementioned compound having a cationically polymerizable group in the amount of 10–10,000 parts by weight, based on 1 part by weight of the aforementioned photosensitive onium salt. If the loading of compound having a cationically polymerizable group falls below 10 parts by weight, its curing may become insufficient to provide mechanical strength, possibly resulting in the failure to provide expected adhesion and durability. On the other hand, if its loading goes beyond 10,000 parts by weight, a loading proportion of the photosensitive onium salt, while effective to cause the photocurable composition to cure, becomes relatively small, possibly resulting in the difficulty to increase a cure rate to a sufficient level even if a loading proportion of the compound either represented by the formula (1) or containing a structure of the formula (1) as a substituting group is caused to decrease.

For the aforestated reasons, it is more preferred that the photocurable composition contains 0.001–100 parts by weight of the compound either represented by the formula (1) or containing, as a substituting group, a structure of the formula (1), and 10–10,000 parts by weight of the compound having a cationically polymerizable group, respectively based on 1 part by weight of the photosensitive onium salt.

When desired, a sensitizer may be added to promote photopolymerization or photocure. Any sensitizer can be used, so long as it serves to increase a radiation sensitivity of the composition. Examples of sensitizers include anthracene, perylene, coronene, tetracene, benzanthracene, phenothiazine, flavin, acridine, ketocoumarin, thioxanthone derivatives, benzophenone, acetophenone and the like.

Preferred for use as the sensitizer are thioxanthone derivatives which exhibit the excellent ability to increase a sensitivity of the composition and can be handled easily.

Examples of thioxanthone derivatives include, but not limited to, 2-chlorothioxanthone, 2,4-dimethylthioxanthone, 2,4-diethylthioxanthone, 2,4-diisopropylthioxanthone, isopropylthioxanthone and the like.

When present, the amount of thioxanthone derivative sentitizer is preferably in the range of 0.01–100 parts by weight, based on 1 part by weight of the aforementioned photosensitive onium salt. The loading of thioxanthone derivative sensitizer in the amount of below 0.01 parts by weight may result in the failure to obtain a sufficient sensitizing action to promote a cure rate. On the other hand, if the loading of thioxanthone derivative sensitizer exceeds 100 parts by weight, its sensitizing action may become excessive to result in the difficulty to assure a desirable open time.

For the aforestated reasons, it is more preferred that the photocurable composition contains 0.001–100 parts by weight of the compound either represented by the formula (1) or containing, as a substituting group, a structure of the formula (1), 10–10,000 parts by weight of the compound having a cationically polymerizable group and 0.01–100 parts by weight of thioxanthone derivative sensitizer, respectively based on 1 part by weight of the photosensitive onium salt.

Preferably, the cationic photocatalyst composition and photocurable composition in accordance with the present invention are photosensitive in the 300–800 wavelength region of the spectrum, wherein at least photosensitive onium salt and thioxanthone derivative are photosensitized.

If photosensitive only in the region below 300 nm; the thick application of photocurable composition may result not only in the increased occurrence of skinning at an incident surface, but also in the failure to achieve uniform curing of the applied composition from its surface layer to deep interior. On the other hand, if photosensitive only in the region above 800 nm, it may become difficult to receive a sufficient radiation energy to accelerate a cure rate, while possible to reduce the occurrence of skinning and achieve uniform curing from the surface layer to deep interior. It is accordingly desired that the cationic photocatalyst composition and photocurable composition be photosensitive in the 300–800 nm wavelength region of the spectrum, as stated above.

A radiation source used to irradiate the photocatalyst or photocurable composition in accordance with the present invention is not paticulraly specified in type, but preferably has an emission distribution in the 300–800 nm region. Suitable sources of radiation include low-pressure mercury lamps, medium-pressure mercury lamps, high-pressure mercury lamps, ultrahigh-pressure mercury lamps, chemical lamps, blacklight lamps, microwave-excited mercury lamps, metal halide lamps, sodium lamps, fluorescent lamps and the like.

For the purposes of suppressing curing in a surface layer only and achieving internal curing of the applied composition, such radiation sources may be used in such a controlled fashion that prevents the passage of radiation in the region of below 300 nm. A natural light, such as sunlight, may also be used.

The photocurable composition in accordance with the present invention is suitable for use in the constitution of adhesives, molded products and the like. Suitable uses include hot melt adhesives, adhesive sheets, liquid adhesives, casting compositions and the like.

In the case where the photocurable composition in accordance with the present invention is used as a hot melt adhesive, the photocurable compostion is desired to melt in the 50–200° C. temperature range and has a viscosity at 200° C. of not exceeding 1,000,000 cps. If the photocurable composition has a property of melting at a temperature of below 50° C., its cohesive strength at normal temperature may be lowered to result in the failure to exhibit an expected initial adhesion immediately after application. On the other hand, if having a property of starting to melt at a temperature of above 200° C., the composition when melt at a high temperature may cause an adherend to undergo thermal deterioration. If the viscosity at 200° C. of photocurable composition exceeds 1,000,000 cps, its wettability and flowability may be markedly reduced to possibly result in the difficulties to perform its application to an adherend and insure a sufficient initial adhesive strength.

Where the photocurable composition in accordance with the present invention is used as a hot melt adhesive, it preferably shows a softening point in the 30–180° C. range when measured according to a ring and ball method. If the photocurable composition has a softening point of below 30° C., its cohesive strength at normal temperature may be lowered to result in the failure to exhibit an expected initial adhesion immediately after it is applied. On the other hand, if having a softening point of above 180° C., the photocurable composition when melt at a high temperature may cause an adherend to undergo thermal deterioration.

In the case where the photocurable composition in accordance with the present invention is used as a hot melt adhesive to join adherends together, the following procedure may preferably be utilized: The photocurable composition is allowed to melt thermally, applied, in a molten state, onto one or both of the adherends, exposed to a radiation either before or after the application, followed by joining the adherends together.

A photocurable adhesive sheet can be obtained by sheeting the photocurable composition in accordance with the present invention. Preferably, this photocurable adhesive sheet, prior to being cured, has a dynamic storage shear modulus of $10^3$ Pa–$10^{10}$ Pa at a frequency of 10 Hz at a temperature of 0–50° C. If the dynamic storage shear modulus is below $10^3$ Pa, the cohesive strength of photocurable composition may be lowered to result in the difficulty to retain its original sheet form. On the other hand, if the dynamic storage shear modulus exceeds $10^{10}$ Pa, the cohesive strength of photocurable composition may be caused to increase to a significant degree that renders it less wettable or adherent with respect to an adherend, possibly resulting in the failure to obtain a sufficient adhesive strength.

The photocurable composition in accordance with the present invention can also be used as a liquid adhesive, as stated earlier. In such an instance, the photocurable composition preferably exhibits a viscosity of 1–1,000,000 cps in the 0–40° C. temperature range. If the viscosity falls below 1 cps, the photocurable composition may become excessively flowable to move readily to an area that is not desired to be applied, resulting in the reduced workability. On the other hand, the viscosity of above 1,000,000 cps may lead to a marked reduction in flowability of the composition to result in the difficulty to perform a coating operation.

A technique used to join members using the photocurable composition or photocurable adhesive sheet in accordance with the present invention can be suitably chosen depending upon the configurations of photocurable composition or photocurable adhesive sheet and others.

When the aforementioned photocurable composition is used as an adhesive to join adherends together, the photocurable composition is applied onto one or both of the adherends and then exposed to radiation, followed by placing the adherends in contact with each other. In this case, due to the incorporation of compound either represented by the formula (1) or containing a structure of the formula (1) as a substituting group, the photocurable composition when irradiated assures a sufficient open time to perform a joint operation.

When the photocurable adhesive sheet is used to join a pair of adherends together, the photocurable adhesive sheet may be exposed to radiation either before or after those adherends are brought into contact with each other. Since the incorporation of compound either represented by the formula (1) or containing a structure of the formula (1) as a substituting group assures a sufficient open time, it is preferred to utilize a procedure whereby the photocurable adhesive sheet is applied to one of the adherends and subsequently exposed to radiation, followed by joining the adherends together by the intervening photocurable adhesive sheet.

In addition to being useful for adhesives, the photocurable composition in accordance with the present invention can be used as a casting composition. In such an instance, the photocurable composition preferably exhibits a viscosity at 20° C. of not exceeding 1,000,000 cps. If its viscosity exceeds 1,000,000 cps, the photocurable composition becomes less flowable to possibly result in the difficulty to cast it into a mold.

Illustrating one preferred technique used to obtain a molded product, the photocurable composition is exposed to a light and then introduced into a mold where it is allowed to cure. Also in this case, the photocurable composition can be introduced smoothly into a mold due to the inclusion of the compound either represented by the formula (1) or containing, as a substituting group, a structure of the formula (1), which acts to retard a cure rate. If the photocurable composition is irradiated after it is cast into a mold, uneven exposure thereof to a light may occur to result in the difficulty to obtain a homogeneous product. On the other hand, irradiating the photocurable composition before it is cast into a mold, as described above, allows even exposure thereof to a light, resulting in obtaining a homogeneous product, i.e., a molded product having a narrow variation in cure level or in mechanical strength throughout in the product.

Suitable additives, such as tackifiers, thickeners and extenders generally known in the art, can be added to the cationic photocatalyst or photocurable composition in accordance with the present invention within the range that is not detrimental to the purposes of this invention.

Examples of tackifiers include rosin resins, modified rosin resins, terpene resins, terpene-phenolic reins, aromatic modified terpene resins, C5 or C9 petroleum resins, coumarone resins and the like. Particularly when adherends consist of polyolefins, the use of rosin or petroleum resins is preferred for their ability to build strong adhesion.

Other additives can also be added to improve coating properties, examples of which include thickeners such as acrylic, epichlorohydrin, iroprene and butyl rubbers; thixotropic agents such as colloidal silica and polyvinyl pyrrolidone; extenders such as calcium carbonate, titanium oxide and clay; and adjusting agents such as polyester, acrylic polymer, polyurethane, silicone, polyether, polyvinyl ether, polyvinyl chloride, polyvinyl acetate, polyisobutylene and waxes.

Where the photocurable composition in accordance with the present invention is utilized as an adhesive, suitable materials can be added to improve its shear bond strength, examples of which include inorganic balloons as comprised of glass, alumina and ceramic; organic spheres such as nylon, acrylic and silicon beads; organic balloons as comprised of vinylidene chloride and acrylics; and single-component fibers such as comprised of glass, polyester, rayon, nylon, cellulose and acetate.

The glass fibers can be added, in the form of fibrous chips, to the composition. The improved shear bond strength is obtained if the photocurable composition is polymerized in the form of being impregnated in a glass woven fabric.

ACTION

The cationic photocatalyst composition in accordance with the present invention contains the compound either, represented by the formula (1) or containing a structure of the formula (1) as a substituting group, in addition to the photosensitive onium salt. The compound either represented by the formula (1) or containing a structure of the formula (1) as a substituting group, if mixed with a cationically photopolymerizable compound, acts to retard a cure rate and assure a sufficient open time after the mixture is exposed to radiation. This is probably because the compound either represented by the formula (1) or containing a structure of the formula (1) as a substituting group is a compound that contains cyclic ether.

While acting to retard a cure rate, the compound either represented by the formula (1) or containing a structure of the formula (1) as a substituting group does not affect the adhesive strength after it is cured. The presence of such a compound thus serves to impart a sufficient open time and a sufficient level of adhesive strength to the photocurable composition after it is cured.

Accordingly, a sufficient length of open time and a sufficient level of adhesive strength can be satisfied simultaneously and designed independently of each other.

Due to the inclusion of the above-described cationic photocatalyst composition and compound having a cationically polymerizable group, the photocurable composition according to the present invention not only assures a sufficient open time but also provides a sufficient adhesive strength after it is cured.

Where the cationically polymerizable group is an epoxy, the further increased adhesion and durability result.

The further inclusion of a thioxanthone derivative increases a cure rate as a result of its sensitizing action. That is, an open time and cure rate can be easily controlled by suitably adjusting a blending ratio of the thioxanthone derivative to the compound either represented by the formula (1) or containing a structure of the formula (1) as a substituting group.

BEST MODE FOR CARRYING OUT THE INVENTION

The following non-limiting Examples illustrate the present invention more specifically.

EXAMPLE 1

Preparation of a Cationic Photocatalyst Composition 20 g of a photosensitive onium salt, OPTOMER SP170 of Asahi Denka Ind. Co., Ltd., and 10 g of 18-crown-6 as a compound represented by the formula (1), were charged into a sample bottle having a volume of about 50 ml where they were mixed and agitated by a stirrer to obtain a cationic photocatalyst composition. 18-crown-6 represents a case of n=6 for the compound B-1 having the structure as specified above.

EXAMPLE 2

Preparation of a Cationic Photocatalyst Composition 20 g of a photosensitive onium salt, OPTOMER SP150 of Asahi Denka Ind. Co., Ltd., and 10 g of 18-crown-6, as a compound represented by the formula (1), were charged into a sample bottle having a volume of about 50 ml where they were mixed and agitated by a stirrer to obtain a cationic photocatalyst composition.

EXAMPLE 3

Preparation of a Cationic Photocatalyst Composition 20 g of a photosensitive onium salt, UVI-6990 of Union Carbide Corp., and 10 g of 18-crown-6, as a compound represented by the formula (1) were charged into a sample bottle having a volume of about 50 ml where they were mixed and agitated by a stirrer to obtain a cationic photocatalyst composition.

EXAMPLE 4

Preparation of a Photocurable Composition 9 g of the cationic photocatalyst composition obtained in Example 1, and 300 g of a bisphenol A based epoxy resin (manufactured by Yuka-Shell Epoxy Co., Ltd., product name: EPICOAT 823), as an epoxy resin compound, were charged into a 0.5 liter separable flask where they were mixed and agitated to obtain a photocurable composition. The photocurable composition such obtained revealed a viscosity of 14,000 cps at 25° C.

The photocurable composition obtained in the manner as described above was used as a liquid adhesive composition to evaluate a period of time the adhesive composition remained unaccompanied by the skinning after it had been irradiated, as well as its shear bond strength, according to the below-described evaluation methods. As a result, the skinning appeared 90 minutes after it had been irradiated. The shear bond strength reached 110 kgf/cm$^2$. When the stainless steel plates were placed in contact with each other 5 minutes after the adhesive composition had been irradiated, the shear bond strength reached 103 kgf/cm$^2$.

COMPARATIVE EXAMPLE 1

The procedure of Example 4 was followed, except that 18-crown-6, as the compound represented by the formula (1), was not used, to obtain a photocurable composition. This photocurable composition revealed a viscosity of 14,000 cps at 25° C.

The photocurable composition such obtained was used as a liquid adhesive composition to evaluate its properties in the same manner as in Example 4. As a result, skinning occurred within a minute after the adhesive composition had been irradiated. The shear bond strength reached 110 kgf/cm$^2$ when stainless steel plates were placed in contact with each other immediately after the adhesive composition had been irradiated, but a value of below 1 kgf/cm$^2$ when they were placed in contact with each other 5 minutes after the adhesive composition had been irradiated.

As can be appreciated from a comparison between Example 4 and Comparative Example 1, the adhesive composition of Example 4, because of its incorporation of the compound represented by the formula (1), exhibits a marked extension of the time until skinning occurs, as well as the increased shear bond strength when stainless steel plates are placed in contact with each other 5 minutes after it is irradiated, i.e., the sufficiently increased cure rate.

EXAMPLES 5–8

The procedure of Example 4 was repeated, except that the photosensitive onium salt, compound represented by the formula (1) and epoxy compound, respectively specified in Table 1, were blended in the ratios (by weight) indicated in Table 1, to provide photocurable compositions which were subsequently evaluated in the same manner as in Example 4. The results are given in Table 1. Dibenzo 18-crown-6 represents a case of n=6, m=2 and $R^6$–$R^9$=hydrogen for the compound B-6 having the structure as specified above.

COMPARATIVE EXAMPLES 2–5

The procedure of Example 4 was repeated, except that the compound represented by the formula (1) was excluded and the photosensitive onium salt and epoxy compound, each specified in Table 1, were blended in the ratios (by weight) indicated in Table 1, to provide photocurable compositions of Comparative Examples 2–5 which were subsequently evaluated in the same manner as in Example 4. The results are given in Table 1.

As apparent from Table 1, in the case of Examples 4–8 where the photocurable compositions contain the compound represented by the formula (1) as well as the photosensitive onium salt, a period of time each photocurable composition remains unaccompanied by skinning after it has been irradiated is extended so that an adhesion operation can be eased.

In contrast, for the photocurable compositions obtained in Comparative Examples 1–5, respectively corresponding to those obtained in Examples 4–8, skinning appeared soon after they had been irradiated. This demonstrates that the photocurable compositions, obtained in Examples 4–8, when used as adhesives, provide a sufficient time to carry out a joint operation, while those obtained in Comparative Examples 1–5 must be subjected to a joint operation soon after irradiation in order to obtain sufficient adhesive strength.

EXAMPLE 9

9 parts by weight of the cationic photocatalyst composition obtained in Example 1, 120 parts by weight of an alicyclic epoxy resin (product name: ERL4221, manufactured by Union Carbide Corp.), 120 parts by weight of epoxidized SBR (product name: EPOFRIEND A1020, manufactured by Daicel Chem. Ind. Co., Ltd.) and 60 parts by weight of a tackifier (unhydrogenated oil resin manufactured by Mitsui Petrochem. Ind. Co., Ltd., product name: FTR6125) were charged into a planetary mixer equipped with a jacket for circulating a hot oil. After the mixer was entirely covered with an aluminum foil, the contents were mixed at 30 rpm at 150° C. for 30 minutes to obtain a photocurable composition. This composition revealed a viscosity of 7,000 cps at 150° C. and a softening point of 90° C.

The photocurable composition obtained in the manner as described above was used as a reactive hot melt adhesive to evaluate an open time and peel adhesion according to the below-described evaluation methods. The measured open time was 5 minutes.

The peel adhesion reached 2.5 kgf/25 mm when stainless steel plates were brought into contact with each other immediately after the adhesive had been irradiated, and 2.3 kgf/25 mm when they were placed in contact with each other 5 minutes after the adhesive had been irradiated.

COMPARATIVE EXAMPLE 6

The procedure of Example 9 was followed, except that the compound represented by the formula (1) was excluded, to obtain a photocurable composition. This photocurable composition revealed a viscosity of 7,000 cps at 150° C. and a softening point of 90° C.

The above-obtained photocurable composition was used as a reactive hot melt adhesive, as similar to Example 9, to evaluate an open time and peel adhesion. As a result, the open time was found to be less than 1 minute. The peel adhesion reached 2.5 kgf/25 mm when stainless steel plates were placed in contact with each other immediately after the adhesive had been irradiated. Joining thereof was found difficult when they were placed in contact with each other 5 minutes after the adhesive had been irradiated.

EXAMPLE 10 AND COMPARATIVE EXAMPLE 7

The procedure of Example 9 was repeated, except that the ingredients were blended in the proportions indicated in Table 2, to obtain photocurable compositions of Example 10 and Comparative Example 7.

The photocurable compositions such obtained were evaluated in the same manner as in Example 9 for viscosity, softening point, open time and peel adhesion. The results are given in Table 2.

As can be seen from the shown results, the photocurable compositions obtained in Examples 9 and 10, because of their inclusion of the compound represented by the formula (1), provide the sufficiently increased open time to carry out a joint operation after they have been irradiated, compared to those obtained in Comparative Examples 6 and 7. On the other hand, the photocurable compositions obtained in the corresponding Comparative Examples 6 and 7 must be subjected to a joint operation immediately after irradiation in order to obtain sufficient adhesive strength.

EXAMPLE 11

100 g of the photocurable composition obtained in Example 9, and 100 g of a liquid mixture of ethyl acetate and toluene (in a 70/30 ratio by weight) were charged into a 0.5 liter separable flask where they were mixed to provide a solution containing the photocurable composition. This solution was subsequently coated onto a release surface of a polyethylene terephthalate film by a Baker applicator and dried at 110° C. for 5 minutes to provide a 100 $\mu$m thick, photocurable adhesive sheet. The resulting photocurable adhesive sheet was found to have a dynamic storage shear modulus of $10^6$ at a frequency of 10 Hz at a temperature of 25° C.

The photocurable adhesive sheet such obtained was evaluated for open time and peel adhesion according to the below-described methods. As a result, the measured open time was 5 minutes. The peel adhesion reached 2.5 kgf/25 mm when stainless steel plates were placed in contact with each other immediately after the adhesive had been irradiated, and 2.3 kgf/25 mm when they were placed in contact with each other 5 minutes after the adhesive had been irradiated.

COMPARATIVE EXAMPLE 8

The procedure of Example 11 was followed, except that the composition of Comparative Example 6 was replaced by the composition of Example 9, to obtain a photocurable adhesive sheet (100 $\mu$m thick). The resulting photocurable adhesive sheet was found to have a dynamic storage shear modulus of $10^6$ at a frequency of 10 Hz at a temperature of 25° C.

The photocurable adhesive sheet was evaluated in the same manner as in Example 11. As a result, the open time was found to be less than 1 minute. The peel adhesion reached 2.5 kgf/25 mm when stainless steel plates were placed in contact with each other immediately after the adhesive had been irradiated. Joining thereof failed when they were placed in contact with each other 5 minutes after the adhesive had been irradiated.

EXAMPLE 12

The photocurable composition obtained in Example 5 was filled in a 1,000 mL syringe. A polyvinyl chloride tube was then connected to a discharge port of the syringe. The photocurable composition was allowed to flow through the polyvinyl chloride tube, while exposed to radiation such that a radiation having a wavelength of 365 nm provided an exposure energy of 900 mJ/cm², into a molding tool (made of Teflon, 100 mm×100 mm×110 mm). The photocurable composition poured into the molding tool was caused to cure at 25° C. for 7 days, and thereafter taken out from the molding tool to obtain a molded product having a shape of regular parallelepiped.

COMPARATIVE EXAMPLE 9

In the attempt to obtain a molded product, the procedure of Example 12 was followed, with the exception that the composition of Example 5 was replaced by the composition obtained in Comparative Example 2. This attempt however failed because the photocurable composition was thickened during its passage through the polyvinyl chloride tube to the degree that prevented its flow into the molding tool.

EVALUATION METHODS

In Examples 1 12 and Comparative Examples 1–9, the following test methods were utilized to evaluate (1) a period of time the composition remained unaccompanied by skinning after it had been irradiated, (2) shear bond strength, (3) open time and (4) peel adhesion.

(1) Time-Measurements

The procedure used to measure a period of time each photocurable composition remains unaccompanied by skinning after it has been irradiated follows:

The photocurable composition is coated on a stainless steel (SUS 304) plate to a thickness of 50 $\mu$m, and then exposed to 30 mW/cm² of ratiation concentrated around 365 nm for 30 seconds. The occurrence of skinning at an exposed surface is inspected by touching it with a finger. That is, when the exposed surface finally provides a wet- or tack-free touch, skinning is judged to have occurred and the time elapsed is recorded as a period of time the photocurable composition remains unaccompanied by skinning after it has been irraditated.

(2) Shear Bond Strength

Accoring to JIS Z 6850, a 150 mm long and 2 mm thick stainless steel (SUS304) plate (may also be referred to as an adherend A) is abraded at its surface with a wet abrasive paper, #280, the surface is degreased with ethyl acetate and then dried, and the photocurable composition is coated on the surface to a thickness of 50 $\mu$m. Subsequently, the coated composition is irradiated with a radiation source in the region of 300–370 nm such that a radiation having a wavelength of 365 nm provides an intensity of 30 mW/cm² for 30 seconds. Either immediately or specified periods of time after the composition has been irradiated, the adherend A coated with the composition is placed in contact with a separately-prepared second adherend A to provide pieces for shear bond strength test. After being left to cure at 25° C. for 7 days, each test piece is subjected to shear bond strength measurement at a pulling rate of 10 mm/min by a tensile tester.

(3) Open Time

In the assembly of adhesion test pieces in (2) or (4), the composition coated on the adherend is irradiated and, after specified periods of time, the adherend is brought into contact with the second adherend. A maximum period of time that permits the assembly of the test piece showing an adhesive strength about comparable to that of the test piece assembled immediately after irradiation is defined as an open time.

(4) Peel Adhesion

The composition obtained in Example 9, Example 10, Comparative Example 6 or Comparative Example 7 is coated on an SPCC dull steel plate (25×125×1.6 mm) by a roll coater set at 150° C. to a thickness of 50–150 $\mu$m. The coating of each composition is exposed to a radiation source in the region of 300–370 nm such that a radiation having a wavelength of 365 nm provides an intensity of 30 mW/cm² for 30 seconds.

In the case of the composition obtained in Example 9 or Comparative Example 6, either immediately or specified periods of time after it has been irradiated, a number 9 cotton fabric (25×125 mm) is placed thereon and pressed at a pressure of 0.5 kgf/cm² at 23° C. for 2 minutes to obtain a piece for peel adhesion test. After being left to cure at 25° C. for 7 days, each test piece is subjected to a dancer roll peeling test according to JIS K 6854 to measure its peel adhesion.

In the case of the composition obtained in Example 10 or Comparative Example 7, either immediately or specified periods of time after it has been irradiated, a number 9 cotton fabric (25×125 mm) is placed thereon, heat pressed at a pressure of 0.5 kgf/cm² at 120° C. for 2 minutes and pressed again at a pressure of 0.5 kgf/cm² at 120° C. for 2 minutes to obtain a piece for peel adhesion test. After being left to cure at 25° C. for 7 days, each test piece is subjected to a dancer roll peeling test according to JIS K 6854 to measure its peel adhesion.

In Table 2, the details of the commercial products used are as follows.

ERL 4221: alicyclic epoxy resin (manufactured by Union Carbide Japan Co., Ltd.)

EPOFRIEND: epoxidized SBS (manufactured by Daicel Chem. Ind. Co., Ltd.)

TABLE 1

| | | | Ex. 4 | Comp. Ex. 1 | Ex. 5 | Comp. Ex. 2 | Ex. 6 | Comp. Ex. 3 | Ex. 7 | Comp. Ex. 4 | Ex. 8 | Comp. Ex. 5 |
|---|---|---|---|---|---|---|---|---|---|---|---|---|
| Photocurable Composition | | | | | | | | | | | | |
| Cationic Photo-catalyst Compo-sition | Compound (A) (P.B.W.) | SP-170 | 2 | 2 | 2 | 2 | 2 | 2 | 2 | 2 | | |
| | | SP-150 | | | | | | | | | 2 | 2 |
| | Compound (B) (P.B.W.) | 18-CROWN-6 | 1 | | 1 | | 1 | | | 1 | | |
| | | DIBENZO-18-CROWN-6 | | | | | | | 1 | | | |
| | Compound (C) (P.B.W.) | EPCOAT828 | 100 | 100 | | | | | | | | |
| | | EP4080 | | | 100 | 100 | | | 100 | 100 | 100 | 100 |
| | | CHDVE | | | | | 100 | 100 | | | | |
| Evaluation Items | | | | | | | | | | | | |
| Viscosity (At 25° C.) (CPS) | | | 14000 | 14000 | 3500 | 3500 | 5 | 5 | 3500 | 3500 | 3500 | 3500 |
| Time Measure (Min.) | | | 90 | <1 | 60 | <1 | 10 | <1 | 40 | <1 | 90 | <1 |
| Sheare Bond Strength (kgf/cm²) | | | | | | | | | | | | |
| Jointed IMM. After Irradiation | | | 110 | 113 | 108 | 105 | 54 | 58 | 105 | 107 | 109 | 105 |
| Jointed 5 Min. After Irradiation | | | 103 | <1 | 106 | <1 | 49 | <1 | 106 | <1 | 102 | <1 |

In Table 1, the details of the commercial products used are as follows.

EPICOAT 828: bisphenol A based epoxy resin (Yuka-Shell. epoxy resin)

EP-4080: hydrogenated bisphenol A epoxy resin (product of Asahi Denka Co., Ltd.)

CHDVE: cyclohexanedimethanol divinyl ether

EPICOAT RXE21: aliphatic epoxy resin (Yuka-Shell epoxy, resin)

FTR 6125: unhydrogenated petroleum resin (manufactured by Mitsui Petrochem. Co., Ltd.)

EFFECTS OF THE INVENTION

The cationic photocatalyst composition in accordance with the present invention contains the compound repre-

TABLE 2

| | | | Ex. 9 | Comp. Ex. 6 | Ex. 10 | Comp. Ex. 7 |
|---|---|---|---|---|---|---|
| Photocurable Composition | | | | | | |
| Cationic Photo-catalyst Compo-sition | Compound (A) (P.B.W.) | SP-170 | 2 | 2 | 2 | 2 |
| | Compound (B) (P.B.W.) | 18-CROWN-6 | 1 | | 1 | |
| | Compound (C) (P.B.W.) | ERL4221 | 40 | 40 | | |
| | | EPO-FRIEND A 1020 | 40 | 40 | 60 | 60 |
| | | EPICOAT RXE 21 | | | 40 | 40 |
| | TACKIFIER | PTR6125 | 20 | 20 | | |
| Evaluation Items | | | | | | |
| Viscosity (At 150° C.) (CPS) | | | 7000 | 7000 | 510000 | 510000 |
| SOFTENING POINT (° C.) | | | 90 | 90 | 90 | 90 |
| OPEN TIME (Min.) | | | 5 | <1 | 5 | <1 |
| Peel Adhesion (kgf/mm) | | | | | | |
| Jointed IMM. After Irradiation | | | 2.5 | 2.5 | 2.3 | 2.1 |
| Jointed 5 Min. After Irradiation | | | 2.3 | | 2.2 | | sented by the formula (1) relative to a photosensitive onium salt as a cationically photopolymerizable catalyst. When such a composition is used in combination with a cationically photopolymerizable compound and irradiated, the action of the compound represented by the formula (1) not only insures a sufficient open time after irradiation, but also results in the provision of a cured product which exhibits the same level of adhesion as those obtained by using conventional cationic photocatalysts.

Accordingly, the photocurable composition in accordance with the presents invention, when irradiated, presents a sufficient open time that allows an easy joint operation and when cured, provides a sufficient adhesive strength.

Also, where the cationically photopolymerizable group is epoxy, the composition when cured provides further enhanced adhesion and durability.

What is claimed is:

1. A cationic photocatalyst composition comprising a photosensitive onium salt having low thermal catalytic activities in the approximate temperature range of 20 to 80° C., and a compound either represented by the following formula (1) or having, as a substituting group, a structure of the following formula (1);

(1) Compound B

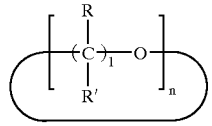

wherein R and R' are selected from hydrogen, halogen, saturated hydrocarbon groups, unsaturated hydrocarbon groups, substituting groups comprising any combination of elements such as carbon, hydrogen, oxygen, nitrogen and sulfur; and l and n each is an integer of 2 or larger.

2. A photocurable composition comprising:
   the cationic photocatalyst composition of claim 1; and
   a compound having at least one cationically polymerizable group in a molecule.

3. The photocurable composition of claim 2, wherein said cationically polymerizable group is an epoxy group.

4. The photocurable composition of claim 2, further comprising a thioxanthone derivative as a sensitizer to increase radiation sensitivity.

5. The photocurable composition of claim 2, wherein the compound either represented by the formula (1) or containing a structure of formula (1) as a substituting group is incorporated into the photocurable composition in an amount of 0.001–100 parts by wt., based on 1 part by wt. of the photosensitive onium salt, and the photocurable composition contains a cationically polymerizable group in the amount of 10–10,000 parts by weight based on 1 part by weight of the photosensitive onium-salt.

6. A cationic photocatalyst composition comprising:

A. a photosensitive onium salt having low thermal catalytic activities in the approximate temperature range of 20–80° C., said photosensitive onium salt being selected from the group consisting of aromatic diazonium salts, aromatic iodonium salts and aromatic sulfonium salts, and B. a compound either represented by formula (1) or having, as a substituting group, a structure of the following formula (1);

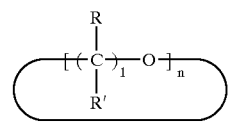

wherein R and R' are selected from hydrogen, halogen, saturated hydrocarbon groups, unsaturated hydrocarbon groups, substituting groups comprising any combination of elements such as carbon, hydrogen, oxygen, nitrogen and sulfur; and l and n each is an interger of 2 or larger.

* * * * *